United States Patent

Saito et al.

[11] Patent Number: 6,080,263
[45] Date of Patent: Jun. 27, 2000

[54] METHOD AND APPARATUS FOR APPLYING A PROTECTING FILM TO A SEMICONDUCTOR WAFER

[75] Inventors: Hiroshi Saito, Okegawa; Tsuyoshi Kurita, Shiraoka-machi; Koji Okamoto, Ageo, all of Japan

[73] Assignee: Lintec Corporation, Japan

[21] Appl. No.: 09/073,156

[22] Filed: May 5, 1998

[30] Foreign Application Priority Data

May 30, 1997 [JP] Japan .................................. 9-157830
May 30, 1997 [JP] Japan .................................. 9-157831

[51] Int. Cl.[7] .................................................. B32B 31/00
[52] U.S. Cl. ........................ 156/253; 156/267; 156/353; 156/522
[58] Field of Search ............................. 156/64, 250, 253, 156/267, 353, 516, 522

[56] References Cited

U.S. PATENT DOCUMENTS

| 4,865,677 | 9/1989 | Matsushita et al. | 156/353 |
| 4,925,515 | 5/1990 | Yoshimura et al. | 156/250 |
| 5,069,738 | 12/1991 | Ruemeli et al. | 156/444 |
| 5,228,944 | 7/1993 | Seifried et al. | 156/500 |
| 5,310,442 | 5/1994 | Ametani | 156/353 |

FOREIGN PATENT DOCUMENTS

| 63-250836 | 10/1988 | Japan . |
| 10-300603 | 11/1998 | Japan . |
| 2256967 | 12/1992 | United Kingdom . |

*Primary Examiner*—James Sells
*Attorney, Agent, or Firm*—Marger Johnson & McCollom, P.C.

[57] ABSTRACT

In an apparatus and method of applying a protecting film to a semiconductor wafer, a semiconductor wafer is placed on top of a table, a protecting film is pressed onto the wafer by a press roller biased toward the table, the table is moved to apply the protecting film to the wafer, a tension roller arranged upstream from the press roller applies a tensile force to the protecting film in a direction opposite the feeding direction of the film, the tensile force of the tension roller is first set at a relatively high value at the beginning of the application of the protecting film to place the protecting film in a stretched state and then at a relatively small value during the application of the protecting film to prevent the portion of the protecting film which has not yet been applied from coming into contact with the wafer, and then, after the protecting film has been applied to the wafer, a cutting blade is used to cut the protecting film to match the shape of the semiconductor wafer by first moving the cutting blade in the Y direction to cut from an angular portion $C_1$ of the orientation flat portion to an angular portion $C_2$, then rotating the table while moving the cutter and the table to align the cutting direction of the cutting blade with the tangential direction of the circumferential portion of the semiconductor wafer, and then rotating the table to cut the protecting film along the circumferential portion of the semiconductor wafer.

9 Claims, 9 Drawing Sheets

BACK TENSION : HIGH

BACK TENSION : LOW

BACK TENSION : LOW

METHOD AND APPARATUS FOR APPLYING A PROTECTING FILM TO A SEMICONDUCTOR WAFER

BACKGROUND OF THE INVENTION

1. Field of the Invention

The present invention relates to a method and apparatus for applying a protecting film to a semiconductor wafer, in which after a protecting film has been applied to the surface of a semiconductor wafer, the protecting film is cut to match the shape of the wafer.

2. Description of the Prior Art

When a semiconductor is manufactured, a grinding process (known as backgrinding) is carried out on the underside surface of the semiconductor wafer (hereafter referred to simply as "wafer") to thin it down in order to carry out miniaturization of the semiconductor chip, and in this process the upper surface (i.e., the surface formed with the circuit) is protected by the application of a protecting film made from a flexible film comprised of a base material such as an adhesive film or the like.

As for known methods of applying this protecting film, in one method the protecting film is applied after being precut to the same shape as the wafer, and in another method the protecting film is first applied to the wafer and then cut to match the shape of the wafer.

In this connection, in the method of the present invention described below, a tensile force (back tension) is applied along the feeding direction of the protecting film and along the opposite direction thereof in order to keep the protecting film in a stretched state so as to prevent wrinkles from forming, and in this state the protecting film is applied to the wafer.

However, in the above described prior art method, it is not possible to adjust the back tension. Consequently, when the back tension is too high, a shrinkage force will act on the applied film, and this creates such risks as warpage or rupturing.

Further, if the back tension is too low, wrinkles may form in the protecting film and air bubbles may enter between the protecting film and the wafer, thus creating the risk that such wafer cannot be used for the grinding process.

On the other hand, with regards to methods of applying the protecting film to the wafer and then cutting the protecting film to match the shape of the wafer, the prior art teaches a method in which such cutting is carried out by moving a cutter along the circumference of the wafer and another method in which the cutter is fixed and cutting is carried out by rotating the wafer.

For positioning of the semiconductor wafer, a straight line portion referred to as an orientation flat portion is formed, and in the prior art method of cutting the wafer protecting tape, the intersection of the orientation flat portion and the circumferential portion of the wafer forms an angular portion, and at this angular portion a remnant (burr) of the cut protecting tape is created.

When a cut remnant exists at this angular portion, such cut remnant can be pulled into the grinding apparatus during the backgrinding process, and if this occurs the entire semiconductor wafer can be destroyed. Consequently, up to now there has been a strong desire for a protecting film applying apparatus that does not leave behind such a cut remnant. Further, in the case where the bonding of the protecting film to the wafer is insufficient, such portion can also be pulled into the grinding apparatus and create the same problem described above, and this has lead to even more desire for improvement.

SUMMARY OF THE INVENTION

A first object of the present invention is to provide a method and apparatus for applying a protecting film to a semiconductor wafer which prevents the wafer from being warped or damaged and which prevents wrinkles from forming in the protecting film.

In order to achieve this first object, in the present invention an adjustable tensile force is applied to the protecting film along a direction opposite the feeding direction of the protecting film when the protecting film is applied to the surface of the semiconductor wafer.

A second object of the present invention is to provide a method and apparatus for applying a protecting film to a semiconductor wafer which makes it possible to accurately cut away the protecting film to match the shape of the wafer.

In order to achieve this second object, in the present invention a semiconductor wafer having an orientation flat portion and a circumferential portion is placed on a table and then a protecting film is applied to the semiconductor wafer. After this is done, the protecting film is cut to match the shape of the semiconductor wafer. This is carried out by moving a cutter or the table to cut the protecting film along the orientation flat portion, rotating the table while the cutter or table is being moved, arranging the cutting direction of the cutter at or below a prescribed angle with respect to the tangential direction of the circumferential portion of the semiconductor wafer, and then rotating the table to cut the protecting film along the circumferential portion of the semiconductor wafer.

Further, in the present invention, a guide roller may be placed in front and/or behind the advancing direction of the cutter to press the protecting film against the semiconductor wafer.

DETAILED DESCRIPTION OF THE PREFERRED EMBODIMENTS

A detailed description of the present invention will now be described with reference to the appended drawings.

Figure 1:
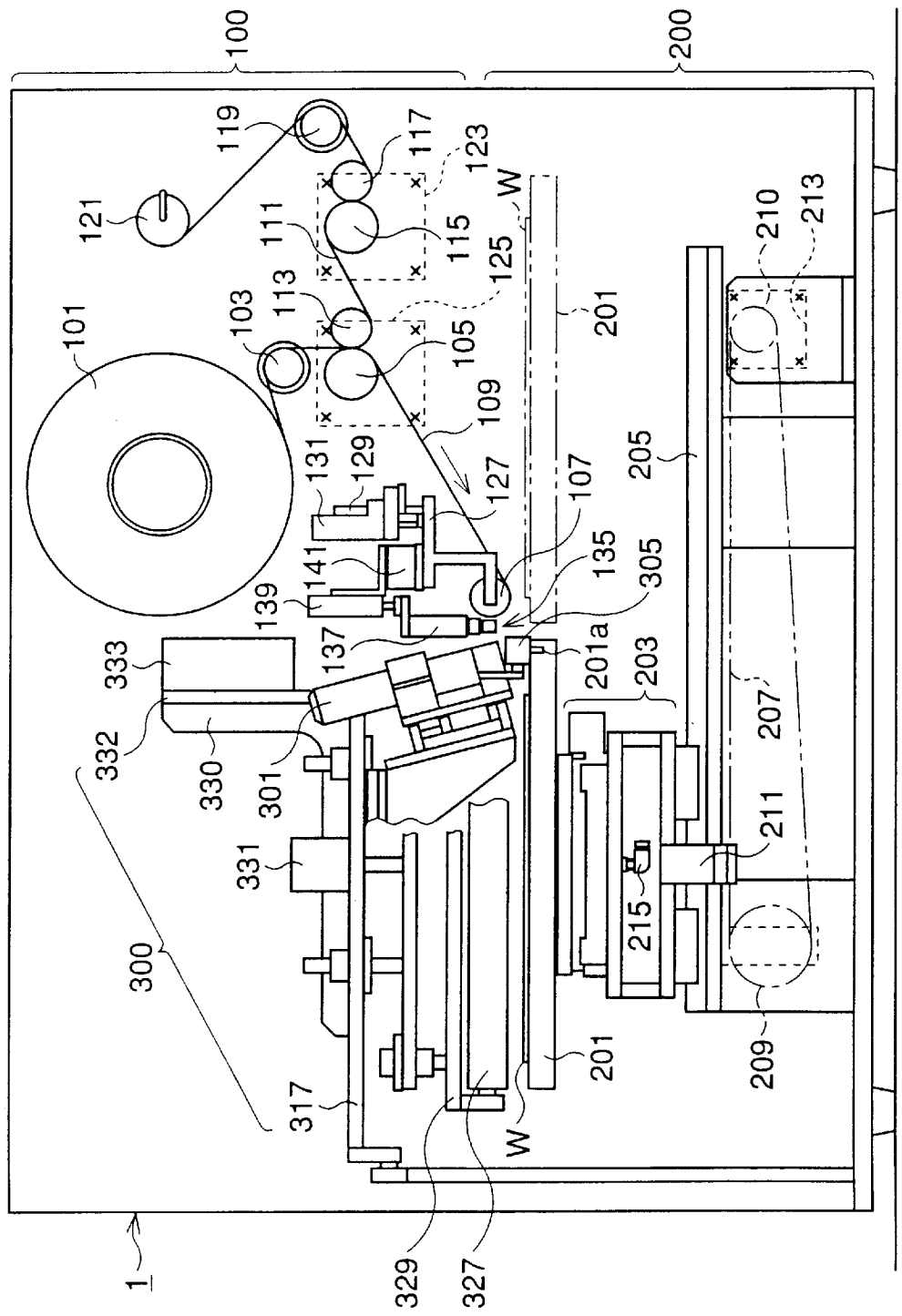
FIG. 1 is a front view of an embodiment of an apparatus for applying a protecting film to a semiconductor wafer according to the present invention.
Figure 2:
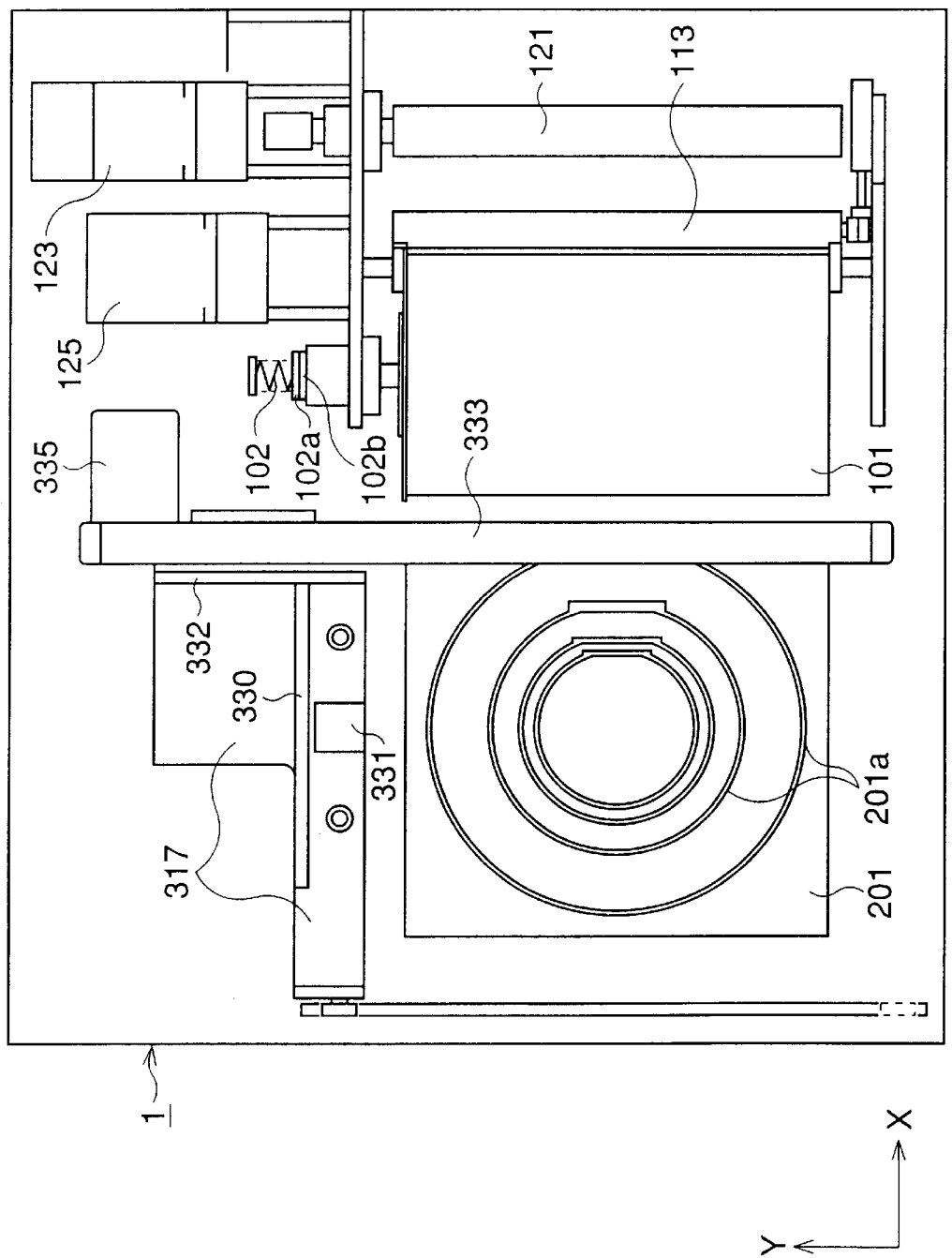
FIG. 2 is a plan view of the apparatus for applying a protecting film to a semiconductor wafer according to the present invention.
Figure 3:
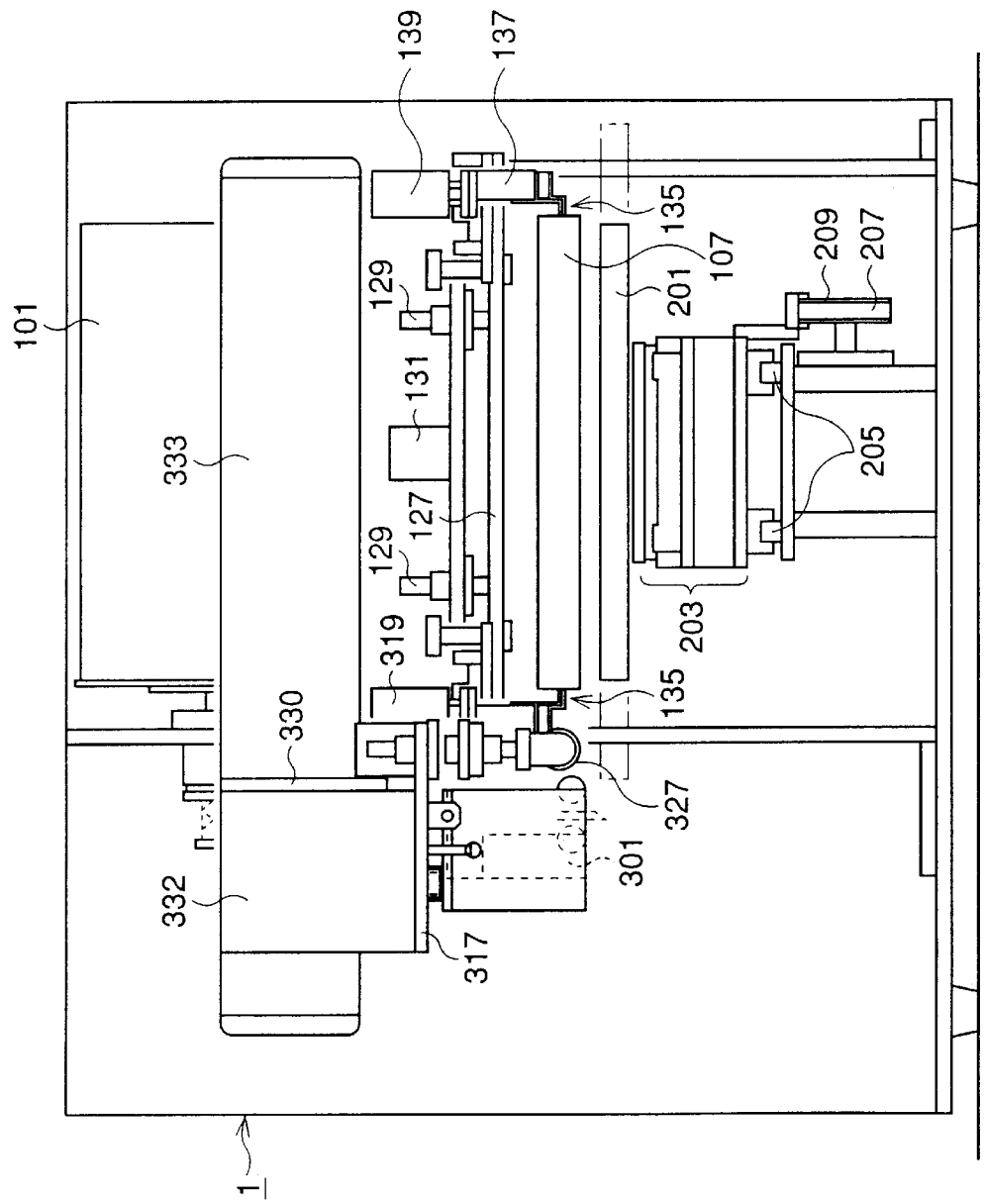
FIG. 3 is a side view of the apparatus for applying a protecting film to a semiconductor wafer according to the present invention.

A front view, a plan view and a side view of one embodiment of the present invention are respectively shown in FIG. 1, FIG. 2 and FIG. 3. As shown in FIG. 1, an apparatus for applying a protecting film to a semiconductor wafer 1 according to the present invention comprises a protecting film supplying portion 100 for supplying protecting film, a wafer conveyor portion 200 for conveying a wafer, and a film cutting portion 300 for cutting the protecting film. Each of these portions will be described in order below.

In the film supplying portion 100, a protecting film 109, comprised of a pressure sensitive adhesive film made by providing a base material such as flexible film with a pressure sensitive adhesive, is wound together with a release liner 111 around a feeding reel 101 and extends to a press roller 107 via a guide roller 103 and a tension roller 105. The rotation shaft of the feeding reel 101 is provided with a spring 102 (FIG. 2) which pushes against a frictional plate 102a and a plate 102b fixed to the top of the rotation shaft in order to exert a frictional force on the rotation shaft. The release liner 111 is separated from the protecting film 109 by a pinch roller 113 and is then wound up by a wind-up reel 121 via a drive roller 115, pinch roller 117 and guide roller 119. The drive roller 115 and the wind-up reel 121 are driven by a motor 123. The tension roller 105 rotates in a direction opposite the feeding direction of the film by means of a torque motor 125 in order to apply a tensile force (back tension) to the protecting film 109. The amount of such back tension can be adjusted as described below.

As shown in FIG. 3, the press roller 107 is held by a holder 127 which is freely guided in the vertical direction by a bush 129 and vertically moved by a cylinder 131. In the vicinity of the press roller 107, a chuck 135 comprised of two L-shaped plates is arranged at both ends of the press roller 107. These two L-shaped plates can be opened and closed so as to hold the protecting film 109 in the space therebetween. In this regard, the L-shaped plates are opened and closed by a cylinder 137. The cylinder 137 is fixed to a cylinder 139 which moves the chuck 135 in the vertical direction. The cylinder 139 is fitted to a cylinder 141 (FIG. 1) which moves the chuck 135 in the cross direction of the protecting film 109 (the left and right direction in FIG. 3). The cylinder 141 is fixed to the holder 127 of the press roller 107, whereby the chuck 135 is raised and lowered as the press roller 107 is raised and lowered.

In the wafer conveyor portion 200, a rotation table 201 for holding a wafer W is fitted onto the top of a table support 203 so as to be freely rotatable thereon. The table 201 is rotated by a motor. The table support 203 is mounted on a rail 205 so as to be freely movable thereon, and a belt 207 is stretched between pulleys 209, 210 so as to be parallel to the rail 205, with the belt 207 being connected to the table support 203 by a connecting plate 211. The pulley 210 is driven by a motor 213, and in this way the rotation table 201 can be made to move in a reciprocating manner along the rail 205 by operating the motor 213.

As shown in FIG. 2, a plurality of grooves 201a having the same shape as the wafer profile and sizes that correspond to various sized wafers are formed in the upper surface of the table 201. Further, a plurality of small holes (not shown in the drawings) are formed in the rotation table 201, and these small holes are connected to a vacuum device (not shown in the drawings) via a vacuum tube 215 (FIG. 1), whereby suction makes it possible to securely hold a wafer W placed on the table 201.

Figure 4B:
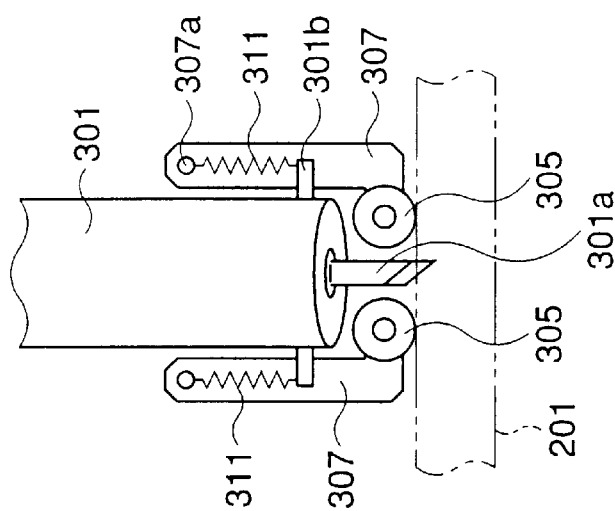
FIGS. 4A and 4B are respectively enlarged front and side views of the cutter portion according to the present invention.

As shown in FIGS. 1 and 4, in the film cutting portion 300, an ultrasonic cutter 301 is arranged at an incline to the side of the wafer W. In this way, by carrying out a cutting operation with a cutting blade 301a inclined to the side of the wafer W, the protecting film 109 will not protrude beyond the periphery of the wafer W. The ultrasonic cutter 301 has a tip portion equipped with the ultrasonically vibrating blade 301a and is held in a cutter holder 303. The blade 301a is situated between guide rollers 305 mounted to support plates 307 at positions in front and behind the blade 301a along the advancing direction of the cutter (the left and right sides of the blade 301a in FIG. 4B). The support plates 307 are fixed to the cutter holder 303 via a slider 309 by means of a fixture 308 so as to be freely moveable in the vertical direction, and tension springs 311 are suspended between pins 301b provided on the ultrasonic cutter 301 and pins 307a provided on the support plates 307. The force of these springs 311 pushes the guide rollers 305 vertically against the upper surface of the rotation table 201.

The cutter holder 303 is connected to a piston 313a of the cylinder 313, and the cylinder 313 is fixed to an inclined plate 315. Further, a slide table 316 is fixed to the inclined plate 315, and the cutter holder 303 is fixed to the slide table 316 via a mounting plate 314. The ultrasonic cutter 301 is moved up and down at an incline along the inclined plate 315 by the cylinder 313. The cutter holder 303 is mounted to the mounting plate 314 in a manner that enables it to be freely replaceable, so that by removing the cutter holder 303 from the mounting plate 314, it is possible to mount an ordinary cutter in place of the ultrasonic cutter.

Figure 4A:
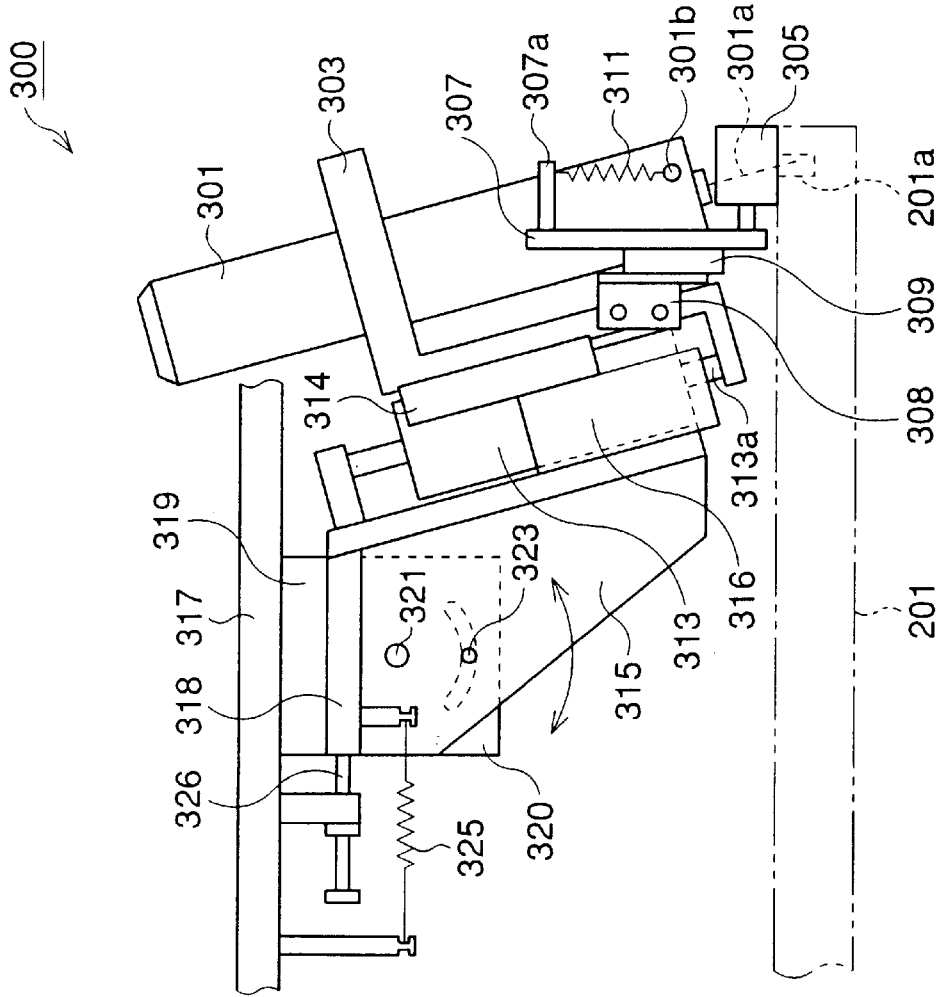

As shown in FIG. 4A, a plate 318 is fixed to a moving plate 317 via a slide table 319, a plate 320 is fixed to the plate 318, and the inclined plate 315 is fastened at two points to the plate 320 by means of bolts 321, 323, in which it is possible to adjust the inclination angle of the inclined plate 315 by changing the fastening position of the bolt 323. The plate 318 is pulled toward the center of the wafer W (toward the left in FIG. 4A) by a spring 325 and is restricted by a setscrew 326. By adjusting the setscrew 326, it is possible to bias the cutting blade 301a toward the side of the wafer W to cut the film. Further, when an unusual load is placed on the cutter, the plate 318 is pulled away in a direction toward the outer periphery of the wafer W (toward the right in FIG. 4A). In this way, it is possible to prevent excessive loads on the wafer W or the cutter.

As shown in FIG. 1, a holder 329 for holding the press roller 327 is fixed to the moving plate 317, and the holder 329 is moved up and down by means of a cylinder 331. The moving plate 317 is fixed via plates 330, 332 to a guide 333 so as to be movable in the Y direction by means of a motor 335. In other words, the cutter 301 and the press roller 327 are fixed to the moving plate 317 and undergo motion in the Y direction by means of the motor 335.

Figure 5:
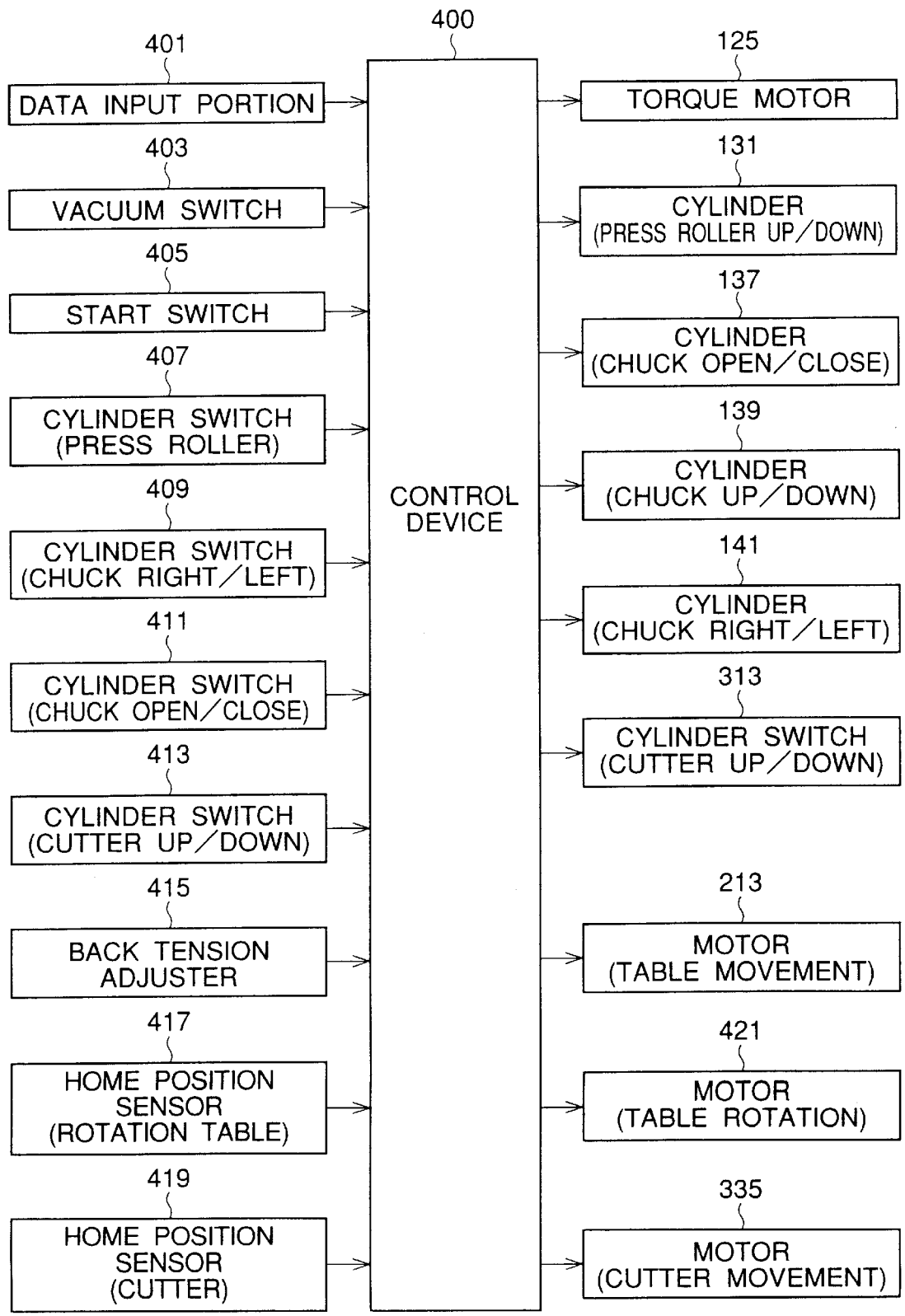
FIG. 5 is a block diagram showing the control system of the apparatus for applying a protecting film to a semiconductor wafer according to the present invention.

FIG. 5 shows a block diagram of the control system of the apparatus described above. In this regard, a control device 400 which serves as a sequencer and the like is comprised of such elements as a CPU and memory. In this control device 400, data such as wafer size and the degree of motion for each motor is input in advance by means of a data input portion 401. Also provided are a vacuum switch 403 for applying suction to a wafer and a start switch 405 which outputs a signal instructing the apparatus to begin operations. Further, cylinder switches 407, 409, 411, and 413 are provided to output a top dead point and a bottom dead point for each cylinder. A back tension adjuster 415 sets the torque for the torque motor 125, home position sensors 417, 419 detect the home position of the table 201 and the cutter 301, and a motor 421 rotates the rotation table 201. As is further shown in FIG. 5, the same reference numbers are used for those parts that are the same as the parts described previously above.

Next, a description of the operation of the above-described apparatus will be given.

First, prior to operating the apparatus, essential data (wafer size, degree of motion for each motor, etc.) is input by means of the data input portion 401, and the back tension value is input by means of the back tension adjuster 415.

Figure 6A:
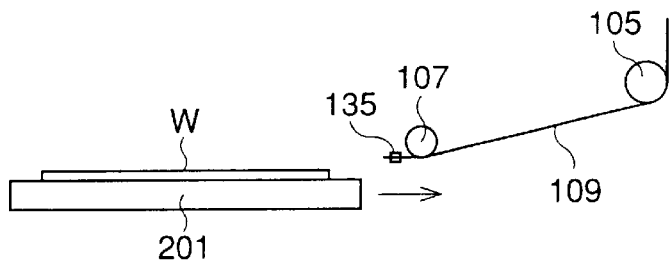
FIGS. 6A–6E are explanatory drawings showing the application operation of the apparatus for applying a protecting film to a semiconductor wafer according to the present invention.
Figure 6B:
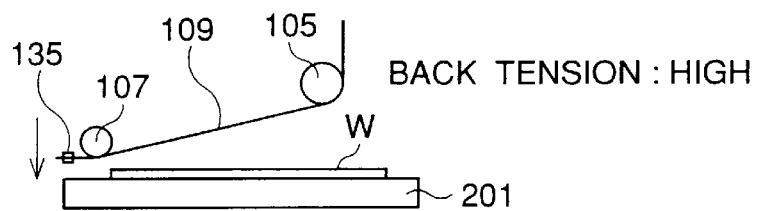

Then, a prepared wafer W is set on the table 201. This may be done manually or by means of a manipulator and an automatic supply device. In particular, the wafer W is placed inside one of the grooves 201a having a size corresponding to that of the wafer W. After that, the vacuum switch 403 is operated to apply suction to the wafer W, and then the start switch 405 is operated to move the table 201 only by the amount input in advance, after which the table 201 is held motionless, as shown in FIGS. 6A, 6B. At this time, the chuck 135 and the press roller 107 are in a raised position, with the chuck 135 held on both sides of the protecting film 109.

Figure 6C:
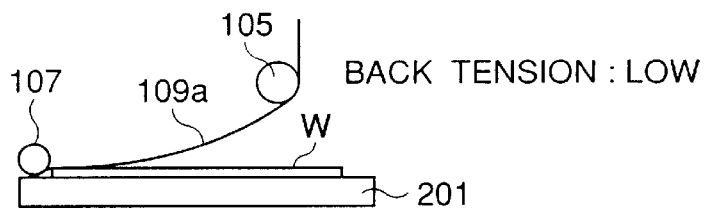
Figure 6D:
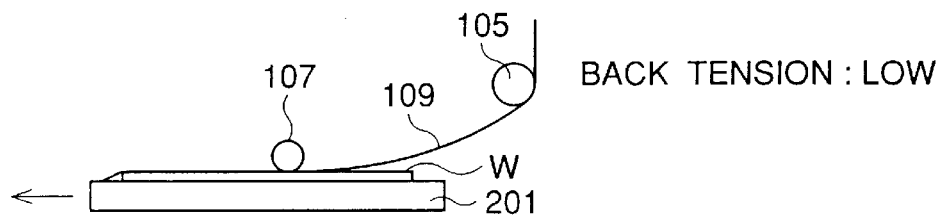
Figure 6E:
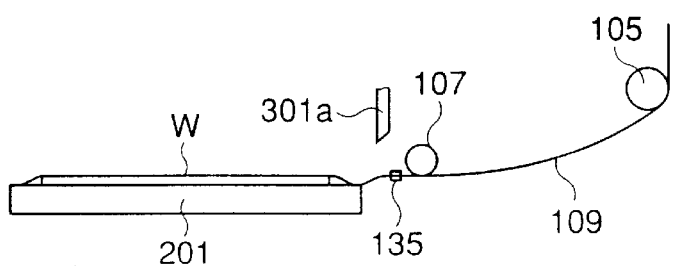
Figure 7:
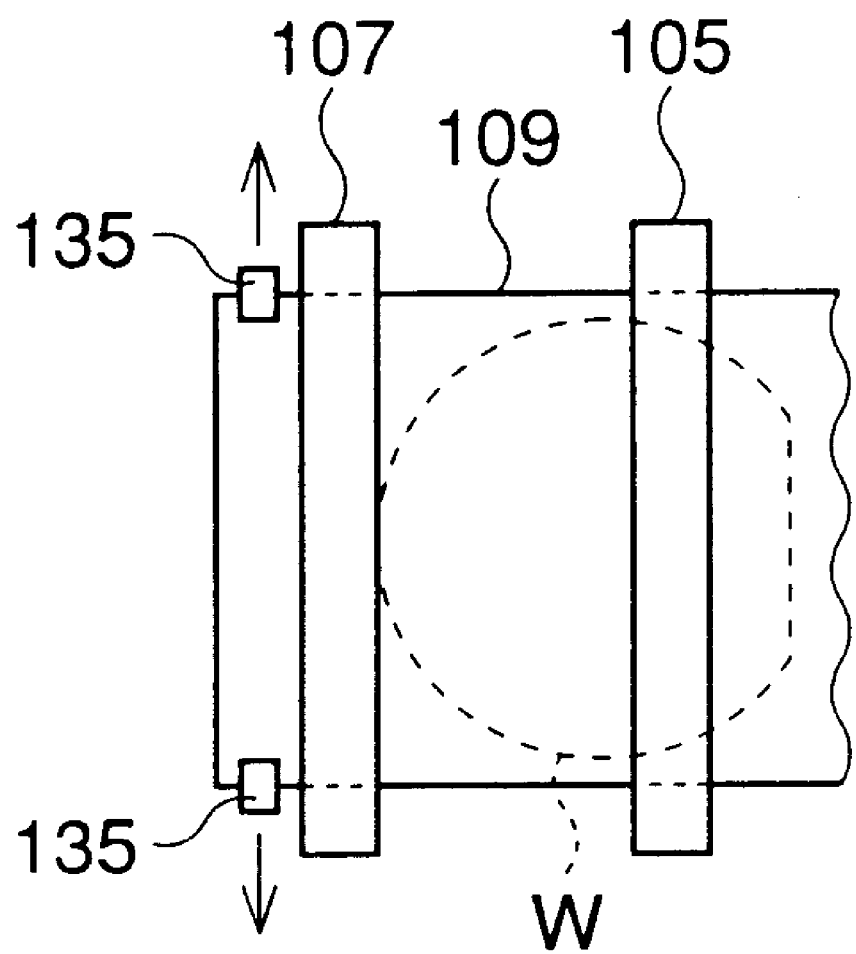
FIG. 7 is a plan view of FIG. 6B.

Next, the press roller 107 and chuck 135 begin to descend (FIG. 6B), and while the chuck 135 is being lowered it also moves in the direction shown by the arrows in FIG. 7 to spread the protecting film 109 in the cross direction. The back tension at this time is set at a degree high enough to stretch the protecting film 109 straight (see FIG. 6B). After that the press roller 107 reaches a wafer outer periphery position and the protecting film 109 is pressed against the table 201. At this time, the chuck 135 is opened, the torque of the torque motor 125 is reduced, and the back tension across the protecting film 109 is set as low as possible to the extent that the portion 109a of the protecting film 109 which has not yet been applied does not come into contact with the surface of the wafer W (see FIG. 6C). This value is set in advance by the back tension adjuster 415 taking into consideration such factors as the weight of the protecting film 109 which extends from the tension roller 105 to the press roller 107 and the speed of movement of the table 201. Of course, the set value may be changed by the back tension adjuster 415. In the state described above, while the press roller 107 presses the protecting film 109 against the wafer W, the table 201 is moved (FIG. 6D) by only a prescribed amount in the feeding direction of the film (to the left in FIG. 6).

In accordance with the above, because no tensile force is placed on the protecting film 109 when it is applied to the wafer W, no shrinkage force will act on the protecting film 109, and this prevents any associated warpage or damage to the wafer W.

Further, because the edge portions of the protecting film 109 are pulled in the cross direction thereof by the chuck 135, a tensile force is applied over the cross direction of the protecting film 109, and this makes it possible to prevent the occurrence of wrinkles when the press roller 107 makes contact. Then, by releasing the lengthwise and widthwise tensile force when the protecting film 109 is being applied, it is possible to prevent a shrinkage force from arising.

After that, the chuck 135 is closed and the edge portions of the protecting film 109 are grasped (FIG. 6E), the cutter 301 is moved along the Y axis (the direction from top to down in FIG. 2), and the protecting film 109 is cut. At this time, the cylinder 331 is simultaneously driven to also lower the side press roller 327 along the Y direction to move together with the cutter 301, whereby the protecting film 109 is pressed against the wafer W by the side press roller 327. Namely, the protecting film 109 undergoes double compression by the press rollers 107, 327 to be firmly applied to the wafer W. Then after cutting has been carried out, the press roller 107 and the chuck 135 are raised and remain on standby at the raised position until the next wafer comes. Further, the side press roller 327 is also raised.

Figure 8A:
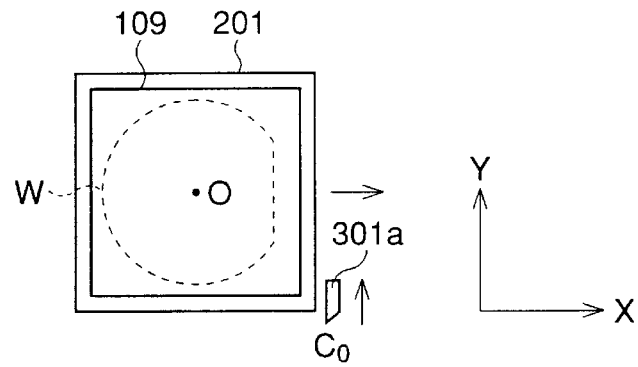
FIGS. 8A–8D are explanatory drawings showing the cutting operation for the periphery of the wafer according to the present invention.
Figure 8B:
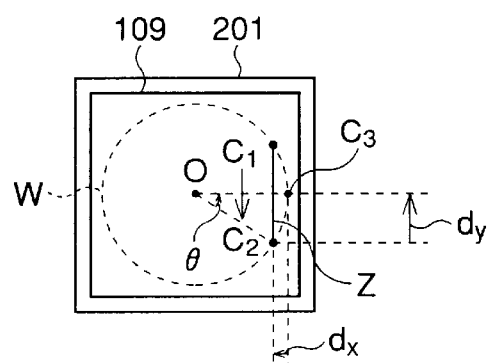

Next, a description of the wafer peripheral portion cutting operation will be given with reference to FIG. 8. At the completion of cutting the protecting film 109 in the above-described process, the cutting blade 301a is at the position $C_0$ in FIG. 8A, after which the cutter 301 is raised and moved (in the Y direction) to its home position, and at the same time the table 201 is moved in the X direction, whereby the cutting blade 301a is placed at an angular portion $C_1$ at one side of the orientation flat portion shown in FIG. 8B. At the angular portion $C_1$, the cutting blade 301a is lowered so as to cut into the protecting film 109, and then the cutting blade 301a follows the orientation flat portion of the wafer W and moves to an angular portion $C_2$ on the other side of the orientation flat portion, thereby cutting the orientation flat portion (FIG. 8B). At this time, no damage will occur because the tip of the cutting blade 301a is inside the groove 201a.

Next, with the cutting blade 301a in the lowered position, the table 201 is moved in the X direction (from the right to the left in FIG. 8B) only over the distance $d_X$ shown in FIG. 8B, while at the same time the cutting blade 301a is moved in the Y direction (the direction from bottom to top in FIG. 8B) only over the distance $d_Y$. Further, in synchronization with the above-described movement, the table 201 is rotated only by an angular amount θ in the counterclockwise direction shown in FIG. 8B about a center of rotation O. Now, if a straight line is drawn from the center O of the table 201 perpendicular to the orientation flat portion, such straight line will intersect an extended curve of the circumferential portion of the wafer W at $C_3$, with the distance between $C_3$ and $C_2$ in the X direction being $d_X$ and the distance between $C_3$ and $C_2$ in the Y direction being $d_Y$.

Figure 8C:
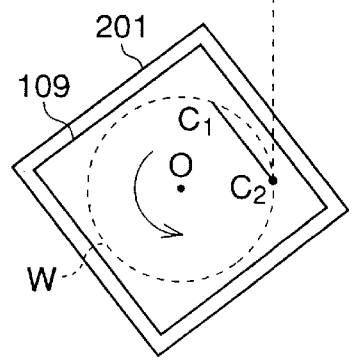
Figure 8D:
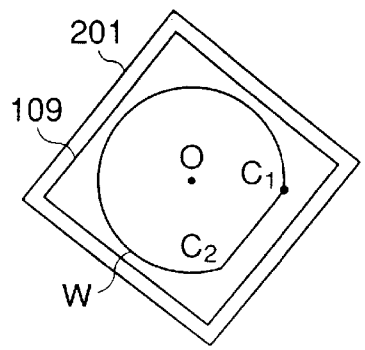

As shown in FIG. 8C, by carrying out the operations described above, the positional relationship between the cutting blade 301a and the wafer W at the angular portion $C_2$ enables the cutting direction of the cutting blade 301a (blade direction) to coincide with the tangential direction of the circumferential portion of the wafer W. At this point, if the table 201 is rotated about the center O, the protecting film 109 is cut along the circumference of the wafer W as shown in FIG. 8D. After such cutting is carried out, the cutter 301 and the table 201 are moved toward their home positions and are brought to a stop as soon as the home position sensors 417, 419 detect the cutter 301 and the table 201 at their respective home positions.

Figure 9:
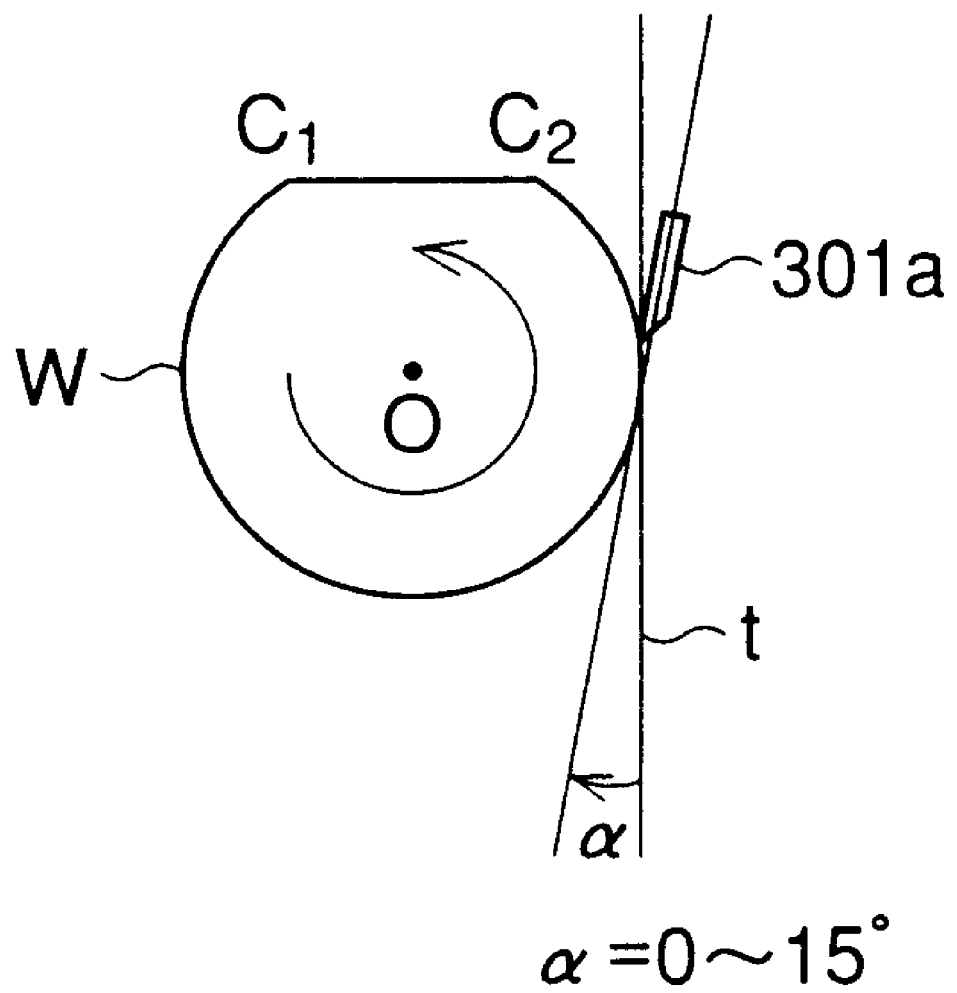
FIG. 9 is another explanatory drawing showing an example cutting operation for the periphery of the wafer according to the present invention.

Now, even though the above example shown in FIG. 8 described the cutting direction of the cutting blade 301a (blade direction) as coinciding with the tangential direction of the wafer W, it is also possible as shown in FIG. 9 to arrange the cutting direction of the cutting blade 301a so as to not coincide with the tangential direction t of the circumferential portion, such as having the two directions being offset at or below a prescribed angle (e.g., α=0~15°). As is further shown in FIG. 9, by arranging the cutting direction of the cutting blade 301a inside the tangential direction of the circumferential portion of the wafer W, it is possible to cut the protecting film 109 along the periphery of the wafer W even if the wafer W is slightly eccentric. Now, if the cutting blade 301a moves too far inside, the cutting blade 301a is moveable to the outside against the biasing force of the spring 325.

In carrying out the operation above, because the protecting film is cut with the cutting direction matching the tangential direction of the circumferential portion of the wafer, or with the cutting direction arranged at or below a prescribed angle with respect to the tangential direction of the circumferential portion of the wafer, it is possible to cut the protecting film in accordance with the size of the wafer even at the angular portion of the orientation flat portion, and this makes it possible to prevent a cut remnant (burr) from being created.

Furthermore, in the above embodiment, the protecting film is cut with the cutting direction of the cutter fixed. In other words, the direction of the cutting blade does not change (e.g., in the example shown in FIG. 8 the cutting blade 301a is normally held in a fixed direction facing down). Consequently, the present invention makes it possible to carry out accurate cutting. In this connection, the prior art teaches a method in which the direction of the cutting blade is changed to move the cutting blade along the tangential direction of the circumferential portion of the wafer, but in this case it is easy for the cutting position of the tip of the cutting blade to slip and thereby create cut remnants (burrs). In contrast with this, in the above-described embodiment of the present invention the cutting direction of the cutter is fixed, and because this makes it difficult for the tip of the cutting blade to slip away from the cutting position, it becomes possible to accurately match the advancing direction of the cutting blade with the circumferential portion of the wafer. Moreover, such control can be easily carried out.

Further, when the above-described cutting operation is being performed, pressing is carried out by the guide rollers 305 located in front and behind the cutting blade 301a. As a result, no gaps are formed between the protecting film 109 and the table 201, and this makes it possible to carry out stable cutting. Further, because it is possible to tightly bond the protecting film 109 to the wafer W, cut remnants (burrs) are not easily created, and therefore there are no cut remnants that might be wound up during the grinding process, and this also makes it possible to prevent water from seeping in. As for the guide rollers 305, it is not necessary to always place them both in front and behind the cutter, and instead it is possible to place such a guide roller only in front or only behind the cutter.

After the protecting film 109 has been cut from the circumferential portion of the wafer W, the remaining portion of the protecting film 109 which was not bonded to the wafer W is peeled away, the wafer W is removed, and a new wafer is brought in. These operations may be carried out manually or fully automatically by using such devices as a manipulator and an automatic supply device. After the new wafer is brought in, the same operations described above are repeated.

In the description given above, the press roller 107 held motionless while the table 201 was moved to apply the protecting film 109. However, the present invention is not limited to this arrangement, and instead it is also possible to hold the table 201 motionless while moving the press roller 107.

In the above-described apparatus, the movement of the cutting blade from FIGS. 8B to 8C may be carried out while maintaining the positional relationship between the cutter and the protecting film, namely with the cutter following the angular portion of the orientation flat portion. In this way, the continuity of the cutting point of the protecting film is maintained, and this makes it possible to reliably prevent the creation of cut remnants and burrs at the angular portion of the wafer. In one example method of carrying this out, the angular portion $C_2$ of the wafer may be drawn along tracks that follow the Z line of the orientation flat portion shown in FIG. 8B, with the movement speed of the table in the X direction and the rotation speed of the table being appropriately set, and the movement speed of the cutter 301 being set to match the movement speed of the angular portion $C_2$ in the Y direction.

Further, even though the movement of the cutting blade from FIGS. 8B to 8C was carried out with both the cutter and the table being moved in the above-described embodiment, it is also possible to move just the cutter or just the table. In the description given for FIG. 8B, after the orientation flat portion was cut away, the cutter was moved from the $C_2$ position in FIG. 8B to the $C_3$ position, and this movement may be carried out by moving only the cutter in the XY directions or only the table in the XY directions.

As described above, because the present invention makes it possible to adjust the back tension when the protecting film is being applied, it becomes possible to apply the protecting film to a semiconductor wafer without causing warpage or damage to the semiconductor wafer.

Further, the present invention makes it possible to cut the protecting film in accordance with the shape of the wafer even at the angular portion of the orientation flat portion, whereby it becomes possible to prevent the creation of cut remnants. Further, by carrying out pressing with guide rollers arranged in front and/or behind the cutting blade, the protecting film can be firmly bonded to the wafer, and this also prevents the creation of cut remnants and the like.

What is claimed is:

1. A method of applying a protective film to a semiconductor wafer, in which the semiconductor wafer having an orientation flat portion and a circumferential portion is placed on a table and then a protecting film is applied to the semiconductor wafer and is cut to match the shape of the semiconductor wafer, the steps comprised of:

a first step in which a cutter or the table is moved to cut the protecting film along the orientation flat portion;

a second step in which the table is rotated while the cutter or table is being moved, with the cutting direction of the cutter arranged at or below a prescribed angle with respect to the tangential direction of the circumferential portion of the semiconductor wafer; and a third step in which the table is rotated to cut the protecting film along the circumferential portion of the semiconductor wafer.

2. The method of claim 1, wherein at the second step, after the cutter has cut the orientation flat portion of the semiconductor wafer and reached an angular portion thereof, the positional relationship between the cutter and the protective film at that time is maintained, with the cutting direction of the cutter being arranged at or below the prescribed angle with respect to the tangential direction of the circumferential portion of the semiconductor wafer.

3. The method of claim 1, wherein the cutting direction of the cutter is fixed.

4. An apparatus for applying a protecting film to a semiconductor wafer having an orientation flat portion and a circumferential portion, comprising:

a table onto which the semiconductor wafer is placed;

means for applying the protecting film to the semiconductor wafer;

a cutter for cutting the protecting film;

movement means for moving the table and the cutter;

rotation means for rotating the table; and control means for controlling the movement means and the rotation means, wherein the control means first controls the cutter or the table so as to cut the protecting film along the orientation flat portion, then moves the cutter or the table so as to arrange the cutting direction of the cutter at or below a prescribed angle with respect to the tangential direction of the circumferential portion of the semiconductor wafer, and then rotates the table.

5. The apparatus of claim 4, wherein the control means maintains the positional relationship between the cutter and the protecting film, and controls the cutter or the table so as to arrange the cutting direction of the cutter at or below the prescribed angle with respect to the tangential direction of the circumferential portion of the semiconductor wafer.

6. The apparatus of claim 4, wherein the cutting direction of the cutter is fixed.

7. An apparatus for applying a protecting film to a semiconductor wafer having an orientation flat portion and a circumferential portion, comprising:

a single cutter which is used to cut the protecting film applied on both the orientation flat portion and the circumferential portion to match the shape of the semiconductor wafer after the protecting film has been applied to the semiconductor wafer; and at least one guide roller provided in front and/or behind the advancing direction of the cutter to press the protecting film onto the semiconductor wafer.

8. An apparatus for applying a protecting film to a semiconductor wafer, comprising:

a cutter which is used to cut the protecting film to match the shape of the semiconductor wafer after the protecting film has been applied to the semiconductor wafer;

said cutter being inclined toward the semiconductor wafer when cutting; and at least one guide roller provided in front and/or behind the advancing direction of the cutter to press the protecting film onto the semiconductor wafer.

9. The apparatus of claim 8, wherein said cutter is biased toward the side of the semiconductor.

* * * * *